United States Patent
Yan et al.

(10) Patent No.: US 10,598,343 B2
(45) Date of Patent: Mar. 24, 2020

(54) LED LIGHT APPARATUS

(71) Applicant: XIAMEN ECO LIGHTING CO. LTD., Xiamen (CN)

(72) Inventors: Ping Yan, Xiamen (CN); Bin Yi, Xiamen (CN); Maojin Zeng, Xiamen (CN); Xiaoming Yang, Xiamen (CN); Zhihua Wang, Xiamen (CN)

(73) Assignee: XIAMEN ECO LIGHTING CO. LTD., Xiamen (CN)

( * ) Notice: Subject to any disclaimer, the term of this patent is extended or adjusted under 35 U.S.C. 154(b) by 0 days.

(21) Appl. No.: 16/103,912

(22) Filed: Aug. 14, 2018

(65) Prior Publication Data

US 2020/0056761 A1 Feb. 20, 2020

(51) Int. Cl.
*F21V 7/04* (2006.01)
*H05K 1/02* (2006.01)
*H05K 1/18* (2006.01)
*F21S 8/02* (2006.01)
*F21Y 115/10* (2016.01)
*F21Y 113/13* (2016.01)
*F21Y 107/00* (2016.01)

(52) U.S. Cl.
CPC ............ *F21V 7/04* (2013.01); *H05K 1/028* (2013.01); *H05K 1/189* (2013.01); *F21S 8/026* (2013.01); *F21Y 2107/00* (2016.08); *F21Y 2113/13* (2016.08); *F21Y 2115/10* (2016.08); *H05K 2201/10106* (2013.01); *H05K 2201/10484* (2013.01)

(58) Field of Classification Search
CPC .......... F21V 7/04; H05K 1/189; H05K 1/028; H05K 2201/10484; H05K 2201/10106; F21Y 2107/00; F21Y 2113/13; F21Y 2115/10; F21S 8/026
See application file for complete search history.

(56) References Cited

U.S. PATENT DOCUMENTS

| | | | |
|---|---|---|---|
| 2008/0212329 A1* | 9/2008 | Duguay | F21S 8/086 362/310 |
| 2011/0273878 A1* | 11/2011 | Venhaus | F21V 7/00 362/235 |
| 2016/0103268 A1* | 4/2016 | Sui | F21V 7/0008 362/611 |

FOREIGN PATENT DOCUMENTS

| | | | | |
|---|---|---|---|---|
| CN | 201589079 U | * | 9/2010 | ............. F21V 15/01 |
| CN | 203615207 U | * | 5/2014 | ................ F21S 8/04 |

* cited by examiner

*Primary Examiner* — Donald L Raleigh
(74) *Attorney, Agent, or Firm* — Chun-Ming Shih; Lanway IPR Services

(57) ABSTRACT

An LED light apparatus includes a back cover, a surrounding wall, a light source and a surface ring. The back cover has a top side and a back cover inner side. The surrounding wall is connected to the back cover. The light source is fixed to an inner wall side of the surrounding wall. The surface ring has a surface ring inner side connected to the surrounding wall. The surface ring inner side, the inner wall side and the back cover inner side form a light movement space. The back cover inner side has a three-dimension curve surface for reflecting light to the light opening of the surface ring.

19 Claims, 8 Drawing Sheets

LED LIGHT APPARATUS

FIELD OF INVENTION

The present invention is related to a LED light apparatus and more particularly related to a LED light apparatus with less components.

BACKGROUND

There are various lighting devices designed for satisfying different needs. For example, there are light bulbs to be installed on sockets. Such light bulbs are usually easy to be installed by users. For downlight devices used in normal home, it would be important to consider convenience for installation, safety and replacement.

In addition to consider the user aspect, it is found that manufacturers and sales channels are also important places to provide innovative designs. After all, the total cost of a light device, which affects whether the product may be widely broadcasted, is not only manufacturing and component cost. For example, storage cost in sales channel is also an important factor.

Some components, particularly light guide plates, are not easy to be manufactured, compared with other components. In addition, light guide plates usually need more protection and cause manufacturing process more complicated for building a high-end environment.

Therefore, it would be beneficial to provide designs that are easily to be installed, assembled, and thus even help decrease total cost. On the other hand, it would be even better if further advantages may be introduced in the same products.

SUMMARY OF INVENTION

According to an embodiment, an LED light apparatus includes a back cover, a surrounding wall, a light source, and a surface ring.

The back cover has a top side and a back cover inner side. The top side and the back cover inner side are opposite to each other.

The surrounding wall is connected to the back cover at a first peripheral side of the back cover. Usually, a surrounding, no matter a circular surrounding wall or a polygonal surrounding wall, has a top side and a bottom side. The first peripheral side refers to the top side and the second peripheral side, mentioned below, refers to the second peripheral side.

In addition, please noted that there may be holes or gaps in the surrounding wall. The surrounding wall does not need to 100% forming a close surrounding area.

The light source is fixed to an inner wall side of the surrounding wall.

The surface ring has a light opening and a surface ring inner side. The surface ring inner side is connected to a second peripheral side of the surrounding wall.

The surface ring inner side, the inner wall side and the back cover inner side forming a light movement space. The back cover inner side has a three-dimension curve surface for reflecting light to the light opening of the surface ring.

Specifically, the back cover, the surrounding wall and the surface ring together form a containing space. Light emitted from the light source mounted on the inner wall side of the surrounding wall is moved in the containing space. Some lights are moved directly outside via the light opening of the surface ring. Some lights are reflected by the three-dimension curve surface of the back cover, and then move outside via the light opening, too.

As explained in more details in following examples, such structure provides a low cost and simple panel light device, particularly suitable for small size panel light apparatuses, e.g. with diameter less than 10 cm. In such structure, no light guiding plate is even necessary. The three-dimension curve surface enhances more light output via the light opening of the surface ring. Furthermore, such light movement helps randomize light paths, and prevent certain areas having bright or dark areas of the overall light output pattern.

In some embodiments, the LED modules are disposed on a circuit board. The circuit board may have a flexible substrate or a bent aluminum elongated plate. Multiple segments of such circuit board may be used. For polygonal shape light apparatuses, the circuit board may not need to be bent for fitting an inner wall side of the surrounding wall. Instead, several straight elongated strips of circuit boards may fit in such requirements.

In some embodiments, LED modules are disposed along an elongated axis of the circuit board. The elongated axis refers to a virtual line in parallel to the longer side of the circuit board. For example, when the circuit board is an elongated strip, the longer side of the circuit board form a virtual line corresponding to the elongated strip.

Multiple LED modules may be connected in series and disposed in sequence along the elongated axis. One row or multiple rows of the LED modules may be arranged, but preferably, if there is a need to shrink the thickness of the overall light apparatus, one row of LED modules may be used.

In some embodiments, the LED modules may include multiple types of optical characteristics. For example, there may be a first type of LED modules having a first color temperature, and a second type of LED modules having a second color temperature. The two types of LED modules are arranged in alternating order to each other so as to provide flexible color temperature adjustment, with some associated control circuits and wiring.

In some embodiments, the LED modules are located for emitting light in more than one tilt angles with respect to the elongated axis. Specifically, as an example, if there are 30 LED modules, 10 LED modules may be disposed for emitting light with a 15 tilt degrees upwardly with respect to horizontal surface defined by the elongated axis. 10 LED modules may be disposed for emitting light with a 15 tilt degrees downwardly with respect to the horizontal surface defined by the elongated axis. Another 10 LED modules just emit light horizontally without tilt angles.

With such design, the light has more light emitting angles and movement paths in the containing space mentioned above. Weighting of directions may be adjusted depending on the three-dimension curve surface and other design factors.

In some embodiments, the LED modules are located for emitting light with an upper tilt angle with respect to the elongated axis. In some other embodiments, the LED modules are located for emitting light with a lower tilt angle with respect to the elongated axis. The upper tilt angle and the lower tilt angles may also be referred to the horizontal surface in parallel to the light opening, which may be easier to be understood. Drawings are provided as follows to more specifically explain the meaning of these terms.

In some embodiments, the circuit board is located with a tilt angle with respect to the inner wall side of the surrounding wall for adjusting emitting angles of the LED modules.

Specifically, there may be some tilt structure disposed on the circuit board or on the surrounding wall to keep the circuit board being tilt with a desired angle. With such design, even the LED modules emit light perpendicularly to the circuit board, the overall light directions have certain desired tilt angles with respect to the elongated axis.

In some embodiments, the light emitting direction the LED modules are tilt by using a package tilt structure for the LED modules. For example, the package may provide a tilt structure when mounting the LED chips thereon. One package may provide multiple tilt angles for multiple LED chips.

In some embodiments, the back cover has a first side wall and the surface ring has a second side wall. The combination of the first side wall and the second side wall forms the surrounding wall. Specifically, the first side wall and the second side wall may form a sleeve connection structure. The first side wall may be the inner wall or outer wall, with respect to the second side wall.

Alternatively, the first side wall and the second side wall may meet at middle place. Specifically, the first side wall forms a top part of the surrounding wall and the second side wall forms a bottom part of the surrounding wall.

Some connection structures like positioning structure to ensure connection to a specific relative position, clipping, hook structure, screw holes, may also be used in such connection.

In some embodiments, the back cover and the surrounding wall is a one-piece component. Specifically, in such case, the back cover and the surrounding wall may be made in a molding procedure and form a one-piece component during assembling.

In some other embodiments, the surface ring and the surrounding wall is a one-piece component. Similarly, in such case, the back cover and the surrounding wall may be made in a molding procedure and form a one-piece component during assembling.

Please be noted that other components may be attached to these components. But, in a minimum design, there may be only two one-piece components to form the light movement space. A circuit board is placed inside the light movement space and that is all the major components needed to form a simplified light apparatus.

In some embodiments, the surface ring is made of a one-piece component of light diffusion material like PC material mixed with light diffusion material. With such design, the surface ring does not need a further component to fit in the light opening. Instead, the complete surface ring may show a softened light on its surface, even for the part not in the traditional light opening.

In some embodiments, a light diffusion window plate placed in the light opening of the surface ring. For example, a circular light diffusion plastic plate may be installed in the light opening of the surface ring.

In some embodiments, the surrounding wall has a groove for plugging in the circuit board. Such groove, not need to be continuous, may be used for inserting a circuit board, bent strips or straight strips. Instead of using glues, such method may further simplify manufacturing process.

In some embodiments, furthermore, the groove may be disposed with a terminal. When the circuit board is plugged in the groove, the terminal is electrically connected to the circuit board for connecting to an external driver circuit. In other words, the circuit board mounted with LED modules may be plugged into the surrounding wall. Meanwhile, the electricity and even signal connection to an external driver circuit may be completed at the same time. When the terminal provides a proper connecting structure, e.g. a socket. Even the driver circuit may be plugged to the LED light apparatus, and thus such design may provide a very convenient and simple assembly processing.

In some embodiments, the back cover and the surrounding wall are of circular shape, and the three-dimension curved surface has a central convex downwardly facing to the light opening.

Furthermore, in some embodiments, the three-dimension curve has a peripheral concave ring upwardly opposite to the light opening.

In some embodiments, a surface of the back cover inner side comprises reflective material.

In some embodiments, the back cover and the surrounding wall are of a polygonal shape, the three-dimension curve surface is corresponding to the polygonal shape. For example, the back cover and the surrounding walls may be a rectangular shape. The three-dimensional curve surface may be designed for corresponding to the rectangular shape light input for directing more light to the light opening that is also a rectangular shape.

DETAILED DESCRIPTION

According to an embodiment, an LED light apparatus includes a back cover, a surrounding wall, a light source, and a surface ring.

The back cover has a top side and a back cover inner side. The top side and the back cover inner side are opposite to each other.

The surrounding wall is connected to the back cover at a first peripheral side of the back cover. Usually, a surrounding, no matter a circular surrounding wall or a polygonal surrounding wall, has a top side and a bottom side. The first peripheral side refers to the top side and the second peripheral side, mentioned below, refers to the second peripheral side.

In addition, please noted that there may be holes or gaps in the surrounding wall. The surrounding wall does not need to 100% forming a close surrounding area.

The light source is fixed to an inner wall side of the surrounding wall.

The surface ring has a light opening and a surface ring inner side. The surface ring inner side is connected to a second peripheral side of the surrounding wall.

The surface ring inner side, the inner wall side and the back cover inner side forming a light movement space. The back cover inner side has a three-dimension curve surface for reflecting light to the light opening of the surface ring.

Specifically, the back cover, the surrounding wall and the surface ring together form a containing space. Light emitted from the light source mounted on the inner wall side of the surrounding wall is moved in the containing space. Some lights are moved directly outside via the light opening of the surface ring. Some lights are reflected by the three-dimension curve surface of the back cover, and then move outside via the light opening, too.

As explained in more details in following examples, such structure provides a low cost and simple panel light device, particularly suitable for small size panel light apparatuses, e.g. with diameter less than 10 cm. In such structure, no light guiding plate is even necessary. The three-dimension curve surface enhances more light output via the light opening of the surface ring. Furthermore, such light movement helps randomize light paths, and prevent certain areas having bright or dark areas of the overall light output pattern.

Figure 1:
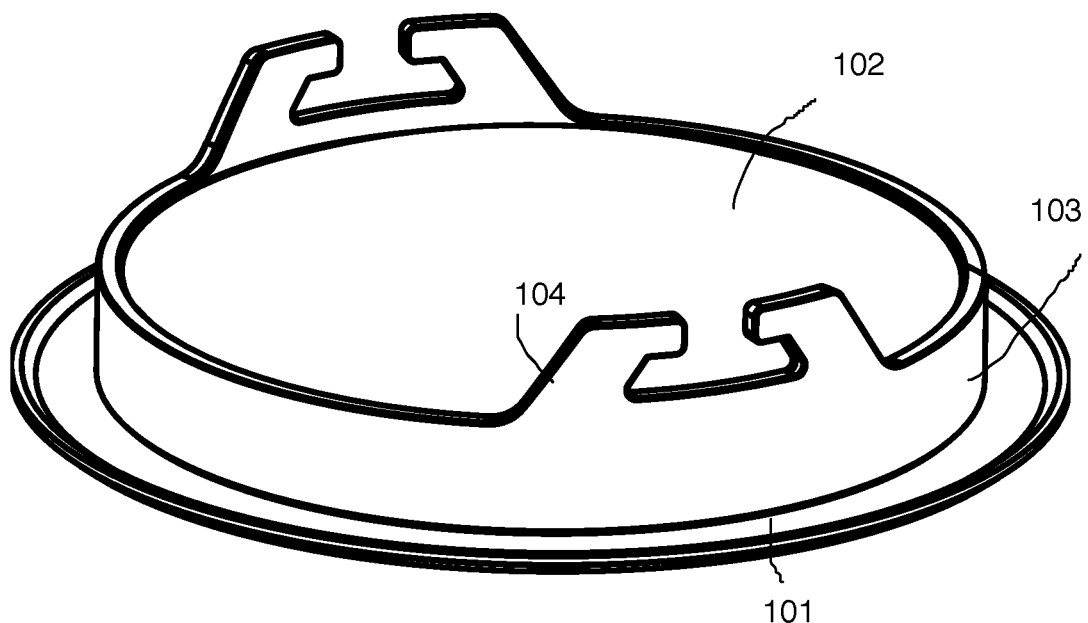
FIG. 1 illustrates a back cover in an LED light apparatus embodiment.

Please refer to FIG. 1. FIG. 1 illustrates a LED light embodiment.

In FIG. 1, there are two connectors 104 for connecting to expandable springs to be fixed to a cavity or an installation box in a ceiling. Please be noted that other connectors may be used for connecting to different types of stations.

The LED light apparatus also has a back cover 102, a surrounding wall 103 and a surface ring 101.

Figure 2:
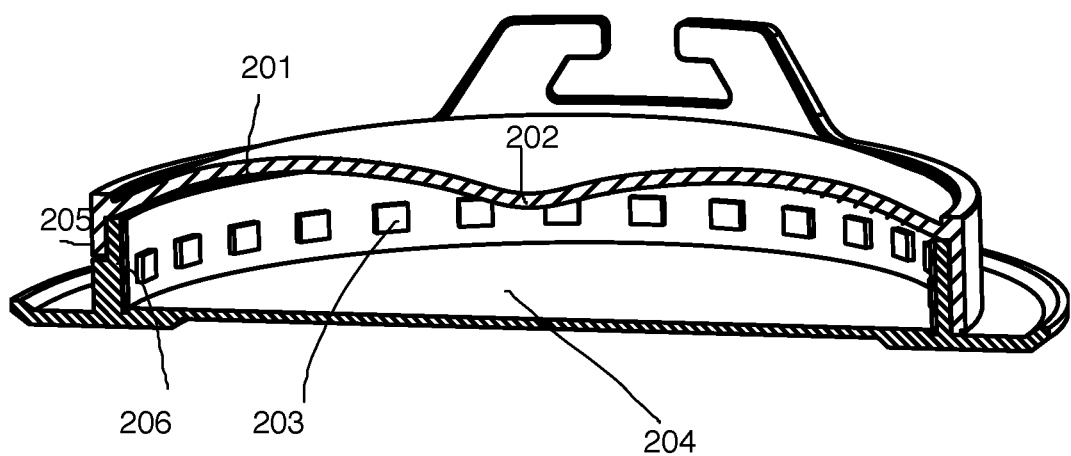
FIG. 2 illustrates a perspective exploded view of a back cover embodiment.

Please refer to FIG. 2, which shows an exploded perspective view to illustrate the inner structure of the LED light embodiment of FIG. 1.

In FIG. 2, the back cover has a three-dimension curved surface. The three-dimension curved surface, in this example, has a central convex 202 downwardly facing to the light opening. In addition, the three-dimension curved surface also has a peripheral concave ring 201 upwardly opposite to the light opening.

There are LED modules 203 disposed on a surrounding wall defined by a second side wall 206 of the surface ring and a first side wall 205 of the back cover. The surrounding wall, the back cover and the surface ring form a light movement space for light of the LED modules 203 to move inside and finally escape from a light opening 204 of the surface ring.

Figure 3:
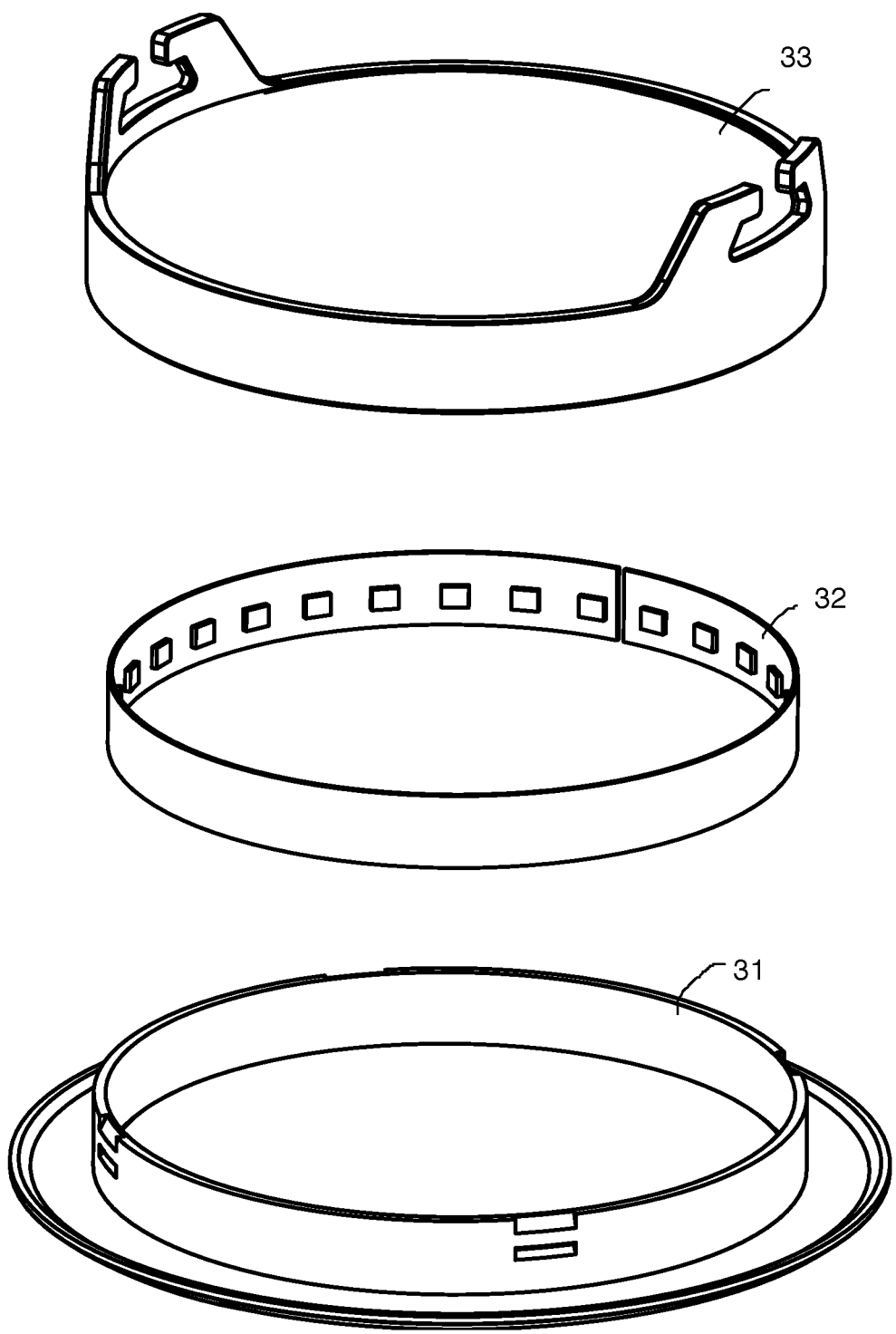
FIG. 3 illustrates a three-component view for an LED light apparatus embodiment.

Please refer to FIG. 3. In FIG. 3, the LED light embodiment has a back cover 33, a circuit board 32 mounted with LED modules, and a surface ring 31. This is an example showing only three components, without a light guiding plate, are sufficient for constructing a minimal LED light apparatus.

Figure 4:
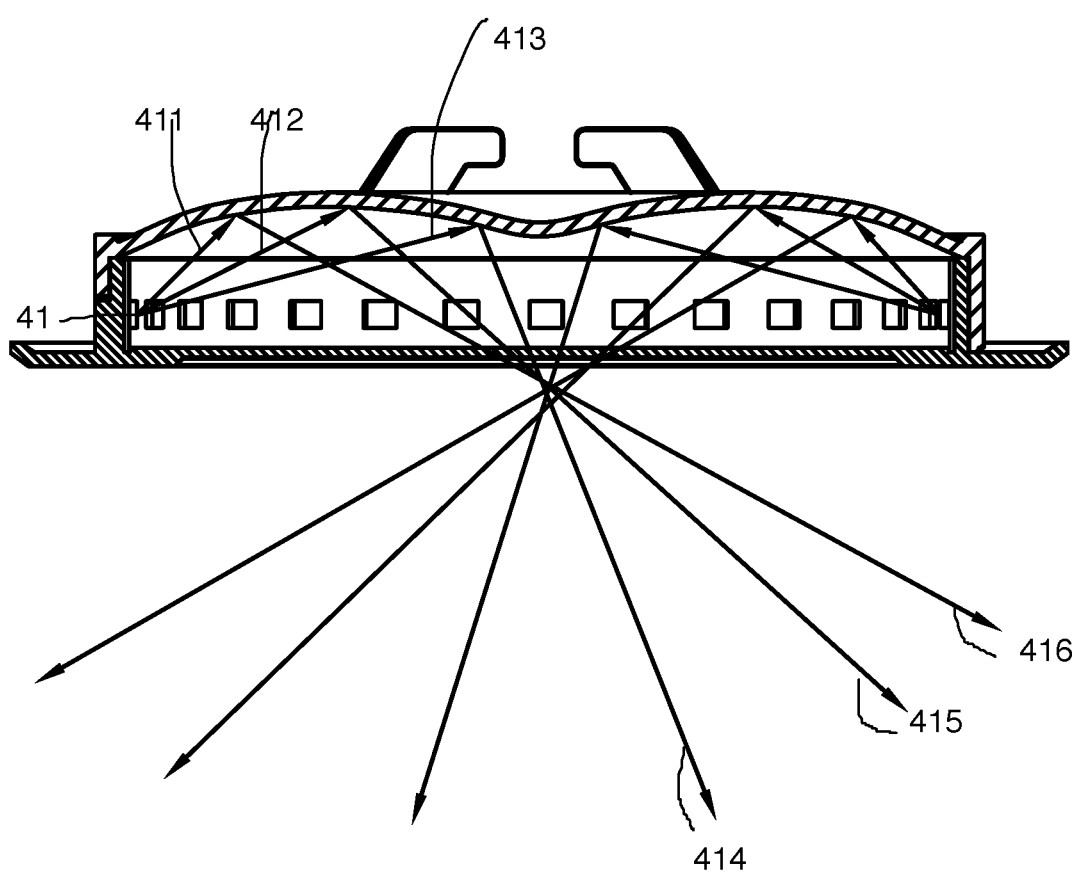
FIG. 4 illustrates an optical path diagram in an embodiment.

Please refer to FIG. 4. In FIG. 4, it shows that light from the LED module 41 may emit in three directions 411, 412, 413 and then reflected to escape out of the LED light apparatus in three corresponding directions 414, 415, 416. The LED module 41 may have other light paths directly escaped out of the light opening of the surface ring, as explained in previous drawings.

Figure 5A:
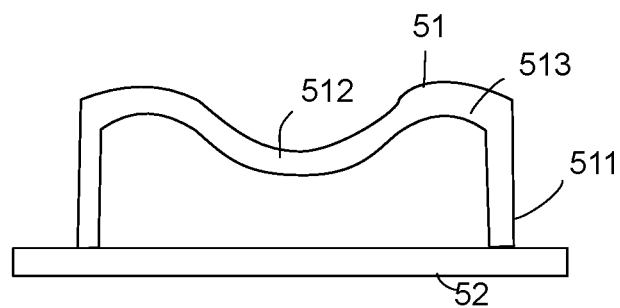
FIG. 5A illustrates a side view diagram of an embodiment.

Please refer to FIG. 5A, which illustrates a simplified diagram showing relations among components of an embodiment.

In FIG. 5A, there is a back cover 51 with three-dimension curved surface 512, 513. The back cover 51 is also integrated with a surrounding wall 511. The surrounding wall is further connected to a surface ring 52.

Figure 5B:
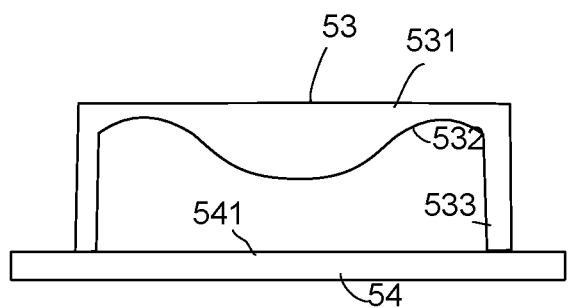
FIG. 5B shows a side view diagram of another embodiment.

FIG. 5B shows an alternative design. In FIG. 5B, the back cover 53 has a flat top side 531 and a curved back cover inner side 532. The surrounding wall has a top side, the first peripheral side connecting to the back cover 53 and a second peripheral side connecting to the surface ring 54. The surface ring 54 has a surface ring inner side 541. The surrounding wall has an inner wall side 533. The inner wall side 533, the back cover inner side 532 and the surface ring inner side 541 together form a light movement space, as illustrated in FIG. 4.

In some embodiments, the LED modules are disposed on a circuit board. The circuit board may have a flexible substrate or a bent aluminum elongated plate. Multiple segments of such circuit board may be used. For polygonal shape light apparatuses, the circuit board may not need to be bent for fitting an inner wall side of the surrounding wall. Instead, several straight elongated strips of circuit boards may fit in such requirements.

In some embodiments, LED modules are disposed along an elongated axis of the circuit board. The elongated axis refers to a virtual line in parallel to the longer side of the circuit board. For example, when the circuit board is an elongated strip, the longer side of the circuit board form a virtual line corresponding to the elongated strip.

Multiple LED modules may be connected in series and disposed in sequence along the elongated axis. One row or multiple rows of the LED modules may be arranged, but preferably, if there is a need to shrink the thickness of the overall light apparatus, one row of LED modules may be used.

In some embodiments, the LED modules may include multiple types of optical characteristics. For example, there may be a first type of LED modules having a first color temperature, and a second type of LED modules having a second color temperature. The two types of LED modules are arranged in alternating order to each other so as to provide flexible color temperature adjustment, with some associated control circuits and wiring.

In some embodiments, the LED modules are located for emitting light in more than one tilt angles with respect to the elongated axis. Specifically, as an example, if there are 30 LED modules, 10 LED modules may be disposed for emitting light with a 15 tilt degrees upwardly with respect to a horizontal surface defined by the elongated axis. 10 LED modules may be disposed for emitting light with a 15 tilt degrees downwardly with respect to the horizontal surface defined by the elongated axis. Another 10 LED modules just emit light horizontally without tilt angles.

With such design, the light has more light emitting angles and movement paths in the containing space mentioned above. Weighting of directions may be adjusted depending on the three-dimension curve surface and other design factors.

In some embodiments, the LED modules are located for emitting light with an upper tilt angle with respect to the elongated axis. In some other embodiments, the LED modules are located for emitting light with a lower tilt angle with respect to the elongated axis. The upper tilt angle and the lower tilt angles may also be referred to the horizontal surface in parallel to the light opening, which may be easier to be understood. Drawings are provided as follows to more specifically explain the meaning of these terms.

In some embodiments, the circuit board is located with a tilt angle with respect to the inner wall side of the surrounding wall for adjusting emitting angles of the LED modules.

Specifically, there may be some tilt structure disposed on the circuit board or on the surrounding wall to keep the circuit board being tilt with a desired angle. With such design, even the LED modules emit light perpendicularly to the circuit board, the overall light directions have certain desired tilt angles with respect to the elongated axis.

In some embodiments, the light emitting direction the LED modules are tilt by using a package tilt structure for the LED modules. For example, the package may provide a tilt structure when mounting the LED chips thereon. One package may provide multiple tilt angles for multiple LED chips.

Figure 7A:
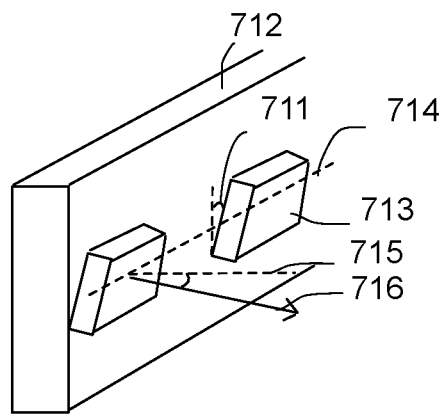
FIG. 7A illustrates a tilt LED module.

Please refer to FIG. 7A, which illustrates a tilt angle of LED modules.

In FIG. 7A, multiple LED modules 713 are disposed on a circuit board 712 with a tilt angle 711. With such tilt angle 711, the light emitting direction 716 has a tilt angle with respect to a vertical line 715 of an elongated axis 714 for disposing the LED modules 713.

Figure 7B:
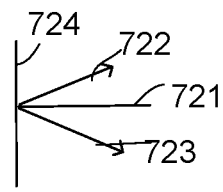
FIG. 7B illustrates several tilt angles.

Please refer to FIG. 7B, which explains several tilt options.

In FIG. 7B, with respect to the surrounding wall 724 and its corresponding horizontal line 721. LED modules may be disposed with a tilt angle so that its output light emission direction may have the tilt angle 722 or the tilt angle 723.

In some embodiments, the back cover has a first side wall and the surface ring has a second side wall. The combination of the first side wall and the second side wall forms the surrounding wall. Specifically, the first side wall and the second side wall may form a sleeve connection structure. The first side wall may be the inner wall or outer wall, with respect to the second side wall.

Alternatively, the first side wall and the second side wall may meet at middle place. Specifically, the first side wall forms a top part of the surrounding wall and the second side wall forms a bottom part of the surrounding wall.

Some connection structures like positioning structure to ensure connection to a specific relative position, clipping, hook structure, screw holes, may also be used in such connection.

In some embodiments, the back cover and the surrounding wall is a one-piece component. Specifically, in such case, the back cover and the surrounding wall may be made in a molding procedure and form a one-piece component during assembling.

In some other embodiments, the surface ring and the surrounding wall is a one-piece component. Similarly, in such case, the back cover and the surrounding wall may be made in a molding procedure and form a one-piece component during assembling.

Please be noted that other components may be attached to these components. But, in a minimum design, there may be only two one-piece components to form the light movement space. A circuit board is placed inside the light movement space and that is all the major components needed to form a simplified light apparatus.

Figure 6A:
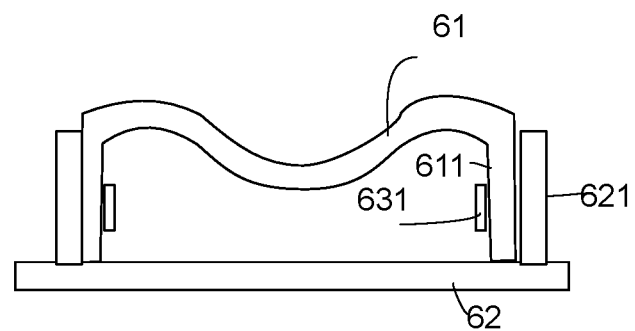
FIG. 6A illustrates a first way for integrating a back cover to a surface ring.
Figure 6B:
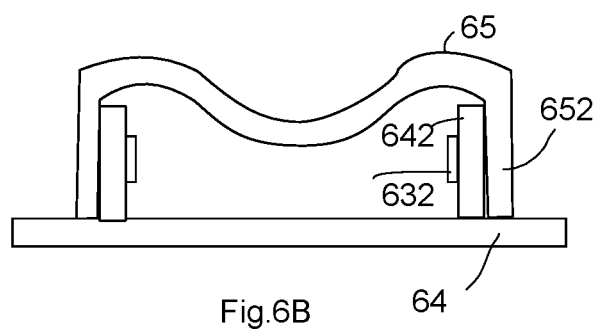
FIG. 6B illustrates a second way to integrate a back cover to a surface ring.
Figure 6C:
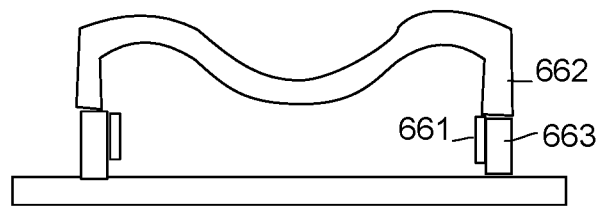
FIG. 6C illustrates a third way to integrate a back cover to a surface ring.

Please refer to FIG. 6A, FIG. 6B and FIG. 6C. FIG. 6A, FIG. 6B and FIG. 6C illustrates several different ways for integrating the components.

In FIG. 6A, the surface ring 62 has a first side wall 621. The back cover 61 has a second side wall 611 disposed with a light source 631. The first side wall 621 is outside the second side wall 611 in this example.

In FIG. 6B, the back cover 65 has a first side wall 652. The surface ring has a second side wall 642 disposed with a light source 632. In this example, the second side wall 642 is inside the first side wall 652.

Both FIG. 6A and FIG. 6B show two side walls connecting with a sleeve structure.

In FIG. 6C, the first side wall 662 of the back cover and the second side wall 663 of the surface ring 663 together form the surrounding wall disposed with a light source 661.

In some embodiments, the surface ring is made of a one-piece component of light diffusion material like PC material mixed with light diffusion material. With such design, the surface ring does not need a further component to fit in the light opening. Instead, the complete surface ring may show a softened light on its surface, even for the part not in the traditional light opening.

In some embodiments, a light diffusion window plate placed in the light opening of the surface ring. For example, a circular light diffusion plastic plate may be installed in the light opening of the surface ring.

In some embodiments, the surrounding wall has a groove for plugging in the circuit board. Such groove, not need to be continuous, may be used for inserting a circuit board, bent strips or straight strips. Instead of using glues, such method may further simplify manufacturing process.

In some embodiments, furthermore, the groove may be disposed with a terminal. When the circuit board is plugged in the groove, the terminal is electrically connected to the circuit board for connecting to an external driver circuit. In other words, the circuit board mounted with LED modules may be plugged into the surrounding wall. Meanwhile, the electricity and even signal connection to an external driver circuit may be completed at the same time. When the terminal provides a proper connecting structure, e.g. a socket. Even the driver circuit may be plugged to the LED light apparatus, and thus such design may provide a very convenient and simple assembly processing.

Figure 8:
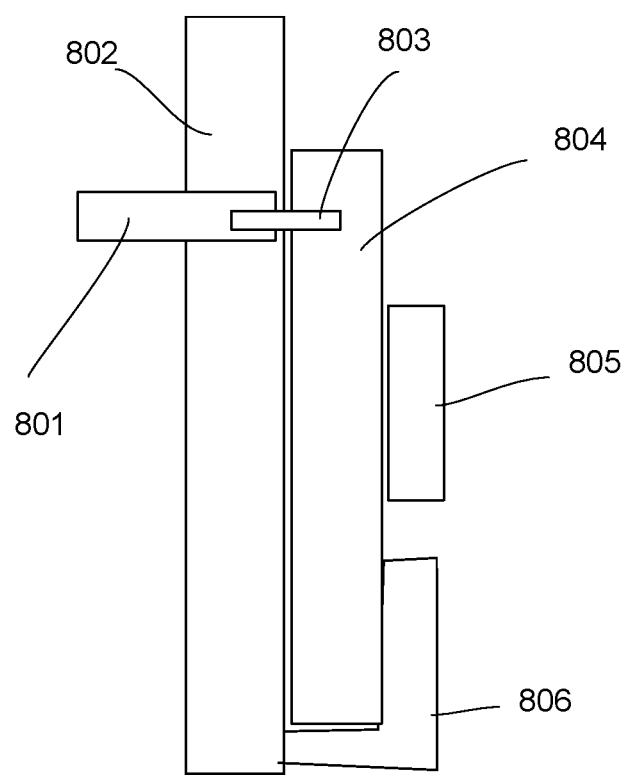
FIG. 8 shows an example of connecting a Light source to a surrounding wall.

Please refer to FIG. 8, which illustrates a plug-in structure for connecting components.

In FIG. 8, a circuit board 803 is plugged to a groove 806 of the surrounding wall 802. In addition, LED modules 805 are disposed on the circuit board 803. The circuit board 804 has a terminal 803 to be plugged to a corresponding socket 801 so as to connect to external driver circuits or control circuits.

In some embodiments, the back cover and the surrounding wall are of circular shape, and the three-dimension curved surface has a central convex downwardly facing to the light opening.

Furthermore, in some embodiments, the three-dimension curve has a peripheral concave ring upwardly opposite to the light opening.

In some embodiments, a surface of the back cover inner side comprises reflective material.

In some embodiments, the back cover and the surrounding wall are of a polygonal shape, the three-dimension curve surface is corresponding to the polygonal shape. For example, the back cover and the surrounding walls may be a rectangular shape. The three-dimensional curve surface may be designed for corresponding to the rectangular shape light input for directing more light to the light opening that is also a rectangular shape.

In addition to the above-described embodiments, various modifications may be made, and as long as it is within the spirit of the same invention, the various designs that can be made by those skilled in the art are belong to the scope of the present invention.

The invention claimed is:

1. An LED light apparatus, comprising:
a back cover, the back cover having a top side and a back cover inner side, the top side and the back cover inner side being opposite to each other;
a surrounding wall connected to the back cover at a first peripheral side of the back cover;
a light source fixing to an inner wall side of the surrounding wall; and
a surface ring having a light opening and having a surface ring inner side connected to a second peripheral side of the surrounding wall, the surface ring inner side, the inner wall side and the back cover inner side forming a light movement space, the back cover inner side having a three-dimension curve surface for reflecting light to the light opening of the surface ring, wherein the back cover has a first side wall and the surface ring has a second side wall, the combination of the first side wall and the second side wall forms the surrounding wall.

2. The LED light apparatus of claim 1, wherein the light source comprises a circuit board fixed to the inner wall side of the surrounding wall.

3. The LED light apparatus of claim 2, wherein a plurality of LED modules are disposed along an elongated axis of the circuit board.

4. The LED light apparatus of claim 3, wherein the LED modules comprises multiple types of optical characteristics.

5. The LED light apparatus of claim 3, wherein the LED modules are located for emitting light in more than one tilt angles with respect to the elongated axis.

6. The LED light apparatus of claim 3, wherein the LED modules are located for emitting light with a upper tilt angle with respect to the elongated axis.

7. The LED light apparatus of claim 3, wherein the LED modules are located for emitting light with a lower tilt angle with respect to the elongated axis.

8. The LED light apparatus of claim 3, wherein the circuit board is located with a tilt angle with respect to the inner wall side of the surrounding wall for adjusting emitting angles of the LED modules.

9. The LED light apparatus of claim 3, wherein light emitting direction the LED modules are tilt by using a package tilt structure for the LED modules.

10. The LED light apparatus of claim 1, wherein the back cover and the surrounding wall are of a polygonal shape, the three-dimension curve surface is corresponding to the polygonal shape.

11. The LED light apparatus of claim 1, wherein the back cover and the surrounding wall is a one-piece component.

12. The LED light apparatus of claim 1, wherein the surface ring and the surrounding wall is a one-piece component.

13. The LED light apparatus of claim 1, wherein the surface ring is made of a one-piece component of light diffusion material.

14. The LED light apparatus of claim 1, further comprising a light diffusion window plate placed in the light opening of the surface ring.

15. The LED light apparatus of claim 2, wherein the surrounding wall has a groove for plugging in the circuit board.

16. The LED light apparatus of claim 15, wherein the groove is disposed with a terminal, when the circuit board is plugged in the groove, the terminal is electrically connected to the circuit board for connecting to an external driver circuit.

17. The LED light apparatus of claim 1, wherein the back cover and the surrounding wall are of circular shape, and the three-dimension curved surface has a central convex downwardly facing to the light opening.

18. The LED light apparatus of claim 17, wherein the three-dimension curve has a peripheral concave ring upwardly opposite to the light opening.

19. The LED light apparatus of claim 1, wherein a surface of the back cover inner side comprises reflective material.

* * * * *